United States Patent
Abrams et al.

(10) Patent No.: US 7,001,827 B2
(45) Date of Patent: Feb. 21, 2006

(54) SEMICONDUCTOR WAFER FRONT SIDE PROTECTION

(75) Inventors: Allan D. Abrams, Essex Jct., VT (US); Donald W. Brouillette, St. Albans, VT (US); Joseph D. Danaher, Hinesburg, VT (US); Timothy C. Krywanczyk, Essex Jct., VT (US); Rene A. Lamothe, Saint Albans, VT (US); Ivan J. Stone, Bakersfield, VT (US); Matthew R. Whalen, Chelsea, VT (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 10/413,698

(22) Filed: Apr. 15, 2003

(65) Prior Publication Data

US 2004/0209444 A1    Oct. 21, 2004

(51) Int. Cl.
*H01L 21/30* (2006.01)
*H01L 21/46* (2006.01)

(52) U.S. Cl. ............... 438/459; 438/691; 438/692

(58) Field of Classification Search ............ 438/64, 438/68, 459, 460, 692, 694, 928, 959, 693, 438/690–3, 691; 257/401; 451/41, 44, 159; 430/312; 134/26; 252/79.1; 117/200
See application file for complete search history.

(56) References Cited

U.S. PATENT DOCUMENTS

| | | | | |
|---|---|---|---|---|
| 3,485,608 A | * | 12/1969 | Cecil | 51/308 |
| 3,740,900 A | * | 6/1973 | Youmans et al. | 451/388 |
| 3,776,789 A | * | 12/1973 | Basi et al. | 438/692 |
| 3,849,948 A | * | 11/1974 | Youmans et al. | 451/29 |
| 3,922,393 A | * | 11/1975 | Sears, Jr. | 427/215 |
| 3,976,330 A | * | 8/1976 | Babinski et al. | 406/84 |
| 4,054,010 A | * | 10/1977 | Shipman | 451/159 |
| 4,117,093 A | * | 9/1978 | Brunner et al. | 423/339 |
| 4,373,991 A | * | 2/1983 | Banks | 451/28 |
| 4,393,628 A | * | 7/1983 | Ottman et al. | 451/63 |
| 4,466,218 A | * | 8/1984 | Ottman et al. | 451/527 |
| 4,869,779 A | * | 9/1989 | Acheson | 156/345.12 |
| 4,892,612 A | * | 1/1990 | Huff | 438/693 |
| 4,910,155 A | * | 3/1990 | Cote et al. | 438/16 |
| 5,181,985 A | * | 1/1993 | Lampert et al. | 438/748 |
| 5,223,734 A | | 6/1993 | Lowrey et al. | 257/401 |
| 5,494,854 A | * | 2/1996 | Jain | 438/692 |
| 5,531,635 A | * | 7/1996 | Mogi et al. | 451/72 |
| 5,562,530 A | * | 10/1996 | Runnels et al. | 451/36 |
| 5,567,503 A | * | 10/1996 | Sexton et al. | 428/143 |
| 5,618,227 A | * | 4/1997 | Tsutsumi et al. | 451/288 |
| 5,632,667 A | * | 5/1997 | Earl et al. | 451/41 |
| 5,665,201 A | * | 9/1997 | Sahota | 438/693 |
| 5,704,987 A | * | 1/1998 | Huynh et al. | 134/6 |

(Continued)

*Primary Examiner*—Alexander Ghyka
(74) *Attorney, Agent, or Firm*—William N. Hogg

(57) ABSTRACT

There is provided a method for making a wafer including the steps of providing a substrate having a first surface, an opposite second surface, and at least one side edge defining a thickness of the substrate, the at least one side edge having a first peripheral region and a second peripheral region adjacent to the first peripheral region. The method includes applying a fluid to the first surface and the first peripheral region of the at least one side edge and removing the opposite second surface and the second peripheral region of the at least one side edge to form a third surface. A semiconductor chip made from the method for making the wafer is also provided.

7 Claims, 1 Drawing Sheet

U.S. PATENT DOCUMENTS

| | | | | |
|---|---|---|---|---|
| 5,755,614 A * | 5/1998 | Adams et al. | ............ | 451/60 |
| 5,780,204 A * | 7/1998 | La et al. | ............ | 430/312 |
| 5,782,984 A * | 7/1998 | Lim et al. | ............ | 134/2 |
| 5,791,969 A * | 8/1998 | Lund | ............ | 451/5 |
| 5,800,725 A * | 9/1998 | Kato et al. | ............ | 216/88 |
| 5,851,924 A * | 12/1998 | Nakazawa et al. | ............ | 438/691 |
| 5,883,060 A * | 3/1999 | Lim et al. | ............ | 510/175 |
| 5,888,882 A * | 3/1999 | Igel et al. | ............ | 438/460 |
| 5,896,877 A * | 4/1999 | Pirker | ............ | 134/153 |
| 5,897,379 A * | 4/1999 | Ulrich et al. | ............ | 438/754 |
| 5,952,242 A * | 9/1999 | Pietsch et al. | ............ | 438/692 |
| 5,958,796 A * | 9/1999 | Prall et al. | ............ | 438/694 |
| 5,963,821 A * | 10/1999 | Kai et al. | ............ | 438/460 |
| 5,981,391 A | 11/1999 | Yamada | ............ | 438/690 |
| 6,043,156 A * | 3/2000 | Kai et al. | ............ | 438/692 |
| 6,043,961 A * | 3/2000 | Yamamoto et al. | ............ | 360/131 |
| 6,054,372 A * | 4/2000 | Flesher et al. | ............ | 438/459 |
| 6,066,562 A * | 5/2000 | Ohshima et al. | ............ | 438/691 |
| 6,083,090 A * | 7/2000 | Bamba | ............ | 451/288 |
| 6,095,899 A * | 8/2000 | Elmar et al. | ............ | 451/28 |
| 6,099,387 A * | 8/2000 | Gilmer et al. | ............ | 451/10 |
| 6,099,662 A * | 8/2000 | Wang et al. | ............ | 134/26 |
| 6,114,245 A * | 9/2000 | Vandamme et al. | ............ | 438/690 |
| 6,132,295 A * | 10/2000 | Tietz et al. | ............ | 451/41 |
| 6,155,275 A * | 12/2000 | Shinbara | ............ | 134/61 |
| 6,159,827 A * | 12/2000 | Kataoka et al. | ............ | 438/464 |
| 6,162,730 A * | 12/2000 | Kai et al. | ............ | 438/690 |
| 6,193,586 B1 * | 2/2001 | Park et al. | ............ | 451/41 |
| 6,236,542 B1 * | 5/2001 | Hartog et al. | ............ | 360/135 |
| 6,245,678 B1 | 6/2001 | Yamamoto et al. | ............ | 438/692 |
| 6,265,314 B1 | 7/2001 | Black et al. | ............ | 438/690 |
| 6,268,237 B1 * | 7/2001 | Flesher et al. | ............ | 438/106 |
| 6,273,791 B1 * | 8/2001 | Kataoka et al. | ............ | 451/41 |
| 6,280,652 B1 | 8/2001 | Inoue et al. | ............ | 252/79.1 |
| 6,284,658 B1 * | 9/2001 | Kato et al. | ............ | 438/690 |
| 6,302,769 B1 | 10/2001 | Nishi et al. | ............ | 451/44 |
| 6,506,681 B1 * | 1/2003 | Grigg et al. | ............ | 438/692 |
| 6,667,242 B1 * | 12/2003 | Siniaguine et al. | ............ | 438/710 |
| 6,709,981 B1 * | 3/2004 | Grabbe et al. | ............ | 438/692 |
| 2001/0001215 A1 * | 5/2001 | Siniaguine et al. | ............ | 257/618 |
| 2002/0052064 A1 * | 5/2002 | Grabbe et al. | ............ | 438/113 |
| 2004/0097053 A1 * | 5/2004 | Yajima et al. | ............ | 438/459 |

* cited by examiner

SEMICONDUCTOR WAFER FRONT SIDE PROTECTION

FIELD OF THE INVENTION

The present invention generally relates to fabrication of semiconductor chips and more particularly to a fabrication process of a semiconductor chip wherein a first surface of the semiconductor wafer, from which the semiconductor chip originates, is protected by a fluid while an opposite surface of the wafer undergoes a grinding and removal step. The invention also relates to the semiconductor chip made from the fabrication process.

BACKGROUND OF THE INVENTION

In the fabrication process of semiconductor devices such as a semiconductor integrated circuit on a semiconductor wafer, it is commonly practiced to divide the semiconductor wafer into individual chips by a dicing process.

Before applying such a dicing process, it is generally necessary to grind a surface of the wafer opposite a first surface where the semiconductor devices are formed, such that the wafer has a predetermined thickness. For example, such a grinding process can be used to reduce the thickness of a wafer to 500 microns ($\mu$) or less according to the specification of the semiconductor device.

At present all wafer thinning (grinding) is done by taping the device side of the wafers prior to grinding to prevent silica slurry from getting on the device surfaces. The wafers are placed device side down on a chuck which pulls vacuum to hold the wafer in place during the grinding process. It is during the grinding that the ground wafer material can contaminate the device side of the wafer.

In order to prevent damaging of the semiconductor wafer from, for example, cracking at the time of grinding, it is commonly practiced to protect the first side, commonly referred to as the front side, of the wafer by an adhesive medium such as an adhesive tape. Generally, the adhesive tape used for such a purpose carries, on a tape base, an adhesive layer of an acrylic resin with a thickness of about 30–40$\mu$. The tape base, in turn, is formed of a polymer such as a polyolefin, polyvinyl, or polyethylene and generally has a thickness of about 100–150$\mu$.

After the grinding process, removal of the adhesive tape is necessary. In order the help facilitate removal of the tape and adhesive, the adhesive layer used for such a purpose is generally added with a surfactant. By doing so, any adhesives remaining on the substrate surface after tape removal can be more easily removed by cleaning the wafer in purified water or in an organic solvent. It should be noted that the composition of adhesives used in such a tape changes substantially lot by lot, and the adhesive of the tape tends to establish a very intimate adhesion with the wafer surface. Adhesive residues often remain, such as amorphous carbon, nitrides or amorphous polyimides, and extensive cleaning may be required. Such a strong adhesion suggests that there is a cross-link reaction between the adhesive and the residual materials on the wafer. Sometimes up to 60 minutes or more of cleaning time may be required. As the front side surface of the wafer generally includes a film such as a polyimide or SiN, any tape adhesive remaining on the wafer surface after tape removal, raises serious performance problems.

Attempts have been made to use an adhesive tape that carries a UV-cure type adhesive on the tape base for the purpose of the protection of the wafer during the grinding process. When using such a UV-cure type tape, an ultraviolet radiation is applied to the wafer covered by the tape before removing the tape from the wafer for facilitating the removal of the tape. As the adhesive is cured as a result of the ultraviolet radiation, the adhesion of the tape to the wafer is reduced substantially and removal of the tape is achieved more easily. Adhesive residues can still remain even with use of a UV-cure type adhesive. Furthermore, the use of a UV-cure tape in the grinding process may cause a problem in the fabrication of a semiconductor memory device that includes a so-called floating gate, such as a flash memory or EEPROM. More specifically, the initial data written into the floating gate of the device may be erased or modified as a result of the ultraviolet radiation. As a result, use of the UV-cure protective tape has not been made a matter of common practice for fabricating semiconductor devices.

It is possible to eliminate the cleaning process by applying an ozone ashing process for a limited time interval against the front side surface of the wafer after removal of the tape, such that any remaining organic materials are oxidized. However, such an ozone ashing process requires a huge facility investment and the cost of the semiconductor is therefore increased. It is also possible to apply a additional post-treatment process by using an organic solvent such as isopropyl alcohol for removing any remaining adhesive residues. Such a post-treatment inevitably lowers the production through-put of the semiconductor chips.

A technique for fabricating a semiconductor chip wafer which would eliminate the use of a protective tape during the grinding process would be a substantial advance in packaging technology.

OBJECTS AND SUMMARY OF THE INVENTION

Accordingly it is the object of this invention to enhance the art of packaging technology.

It is another object of this invention to provide a method of making a semiconductor wafer wherein a tapeless grinding process is utilized.

It is yet another object of this invention to provide a semiconductor chip that will be manufactured with a tapeless grinding process having relatively lower manufacturing costs than many current products.

According to one aspect of the invention there is provided a method for making a wafer comprising the steps of providing a substrate having a first surface, an opposite second surface, and at least one side edge defining a thickness of the substrate, the at least one side edge having a first peripheral region and a second peripheral region adjacent to the first peripheral region. The method includes applying a fluid to the first surface and the first peripheral region of the at least one side edge and removing the opposite second surface and the second peripheral region of the at least one side edge to form a third surface.

BEST MODE FOR CARRYING OUT THE INVENTION

For a better understanding of the present invention, together with other and further objects, advantages and capabilities thereof, reference is made to the following disclosure and appended claims in connection with the above-described drawings.

Figure 1A:
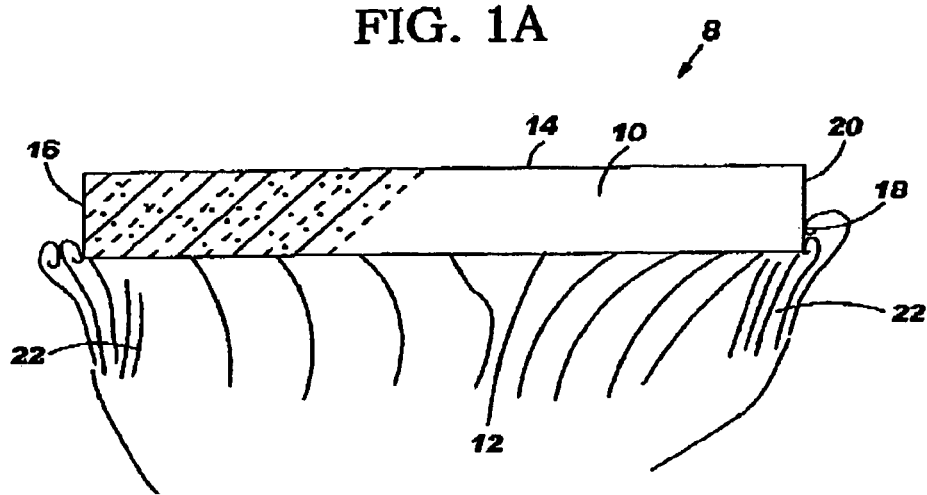
FIGS. 1(A) and 1(B) are diagrams showing a method of making a wafer according to one embodiment of the present invention.

An embodiment of the present invention will now be described referring to FIGS. 1(A) and 1(B). Each step will be explained in order.

First in step 1(A), a wafer 8 including a substrate 10 having a first surface 12 is provided. The wafer 10 can be comprised of silicon, silicon germanium or gallium arsenide. Substrate 10 includes an opposite second surface 14. First surface 12 of substrate 10 can include conductive circuit lines thereon (not shown) comprised of aluminum, copper, gold, lead, tungsten, and alloys thereof. First surface 12 of substrate 10 can also include oxides, nitrides, and polysilicon thereon. Substrate 10 includes at least one side edge 16 defining a thickness of the substrate, the side edge having a first peripheral region 18 and a second peripheral region 20 adjacent to the first peripheral region and second surface 14. Next, a fluid 22 is applied to first surface 12 and first peripheral region 18. The fluid 22 can be applied to first surface 12 and first peripheral region 18 by spraying a liquid or blowing a gas stream against the first surface and first peripheral region. When a liquid is used the spray pressure is from about 1 pound per square inch (psi.) to about 20 psi. When a gas is used, it is blown onto the first surface and first peripheral region at a pressure of from about 1 psi. to about 60 psi. Spraying and blowing can be performed for about 1 minute to about 10 minutes at a temperature of from about 20 degrees Celsius (° C.) to about 40° C. Some examples of gases that can be used in the invention are nitrogen, helium, carbon dioxide, air, and combinations thereof. Some examples of liquids that can be used in this invention are water or oils, such as mineral oil. Applying a fluid to first surface 12 and first peripheral region 18 establishes a barrier around the first surface and first peripheral region. This barrier prevents damage to these surfaces and the conductive circuit lines on first surface 12 during subsequent processing steps, performed on opposite second surface 14, such as grinding, which will be described in more detail below.

Figure 1B:
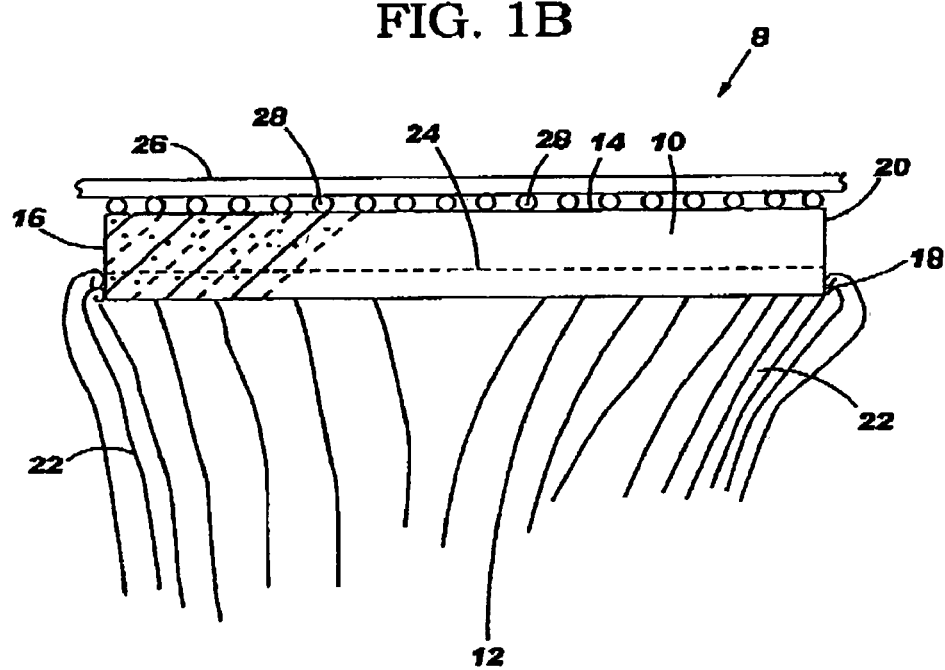

Referring to FIG. 1(B), the next step in the process comprises the step of removing opposite second surface 14 and second peripheral region 20 of one side edge 16 to form a third surface 24 (shown in phantom in FIG. 1(B) as it would exist after completion of the removal step). The removal step can be performed by a process such as grinding using a grinding wheel 26 having diamonds 28 in contact with opposite surface 14 throughout the grinding step. During the grinding step, a liquid, for example, water can be used to assist in lubrication. Surface 14 is continuously removed until it yields third surface 24 by the grinding action of diamonds 28. The size of the diamonds can be from about $4\mu$ to about $60\mu$ in diameter. Diamonds 24 are shown as cross-sections of spheres, however the diamonds can also be irregularly shaped. When diamonds 24 are irregularly shaped, the widest dimension of any one diamond can be from about $4\mu$ to about $60\mu$. Other processes that can be used to remove opposite second surface 14 and second peripheral region 20 are wet etching, for example, with potassium hydroxide and plasma removal. Third surface 24, even though shown as planar and flat can have features of non-planarity and roughness due to the non-uniformity of the grinding process. During the grinding step, particles of substrate 10 are generated. First surface 12 of substrate 10 must be protected from these particles as well as from the grinding slurry. This protection is provided by fluid 22 being applied to first peripheral region 18 and first surface 12 and creating a barrier therearound. The action of fluid 22 also provides a continuous flushing action removing generated particles and grinding slurry. The amount of grinding performed on substrate 10 can be defined by the desired thickness of the substrate needed for semiconductor chip performance. First edge portion 18 can have a thickness of from about $50\mu$ to about $725\mu$ after grinding. After grinding first surface 12 of substrate 10 may be polished. Polishing is performed with a slurry. The slurry is a colloidal suspension of silicon dioxide or aluminum dioxide in distilled water. Silicon dioxide particles used are typically about 500 angstroms in size. A base solution such as potassium hydroxide or sodium hydroxide can be used to adjust the pH of the slurry, if desired. The substrate 10 is then washed with water, spun dry, diced to yield a plurality of semiconductor chips.

In summary, the method of forming a wafer and the semiconductor chip produced therefrom provide a semiconductor chip that is less costly to produce and has low defect levels (higher manufacturing yields) because the surface of the wafer from which the semiconductor chip is formed and a first peripheral region of at least one side edge of the semiconductor chip are protected from the grinding process and its chemicals by the unique tapeless process of the present invention. The unique method is less costly because it eliminates use of tape, a detaping process, breakage of the wafer associated with the detaping process, and avoids other more costly alternatives proposed to remove tape from the wafer when tape is utilized in the grinding process.

While there have been shown and described what are the present considered preferred embodiments of the invention, it will be obvious to those skilled in the art that various changes and modifications may be made therein without departing from the scope of the invention as defined by the appended claims.

We claim:

1. A method for making a wafer comprising the steps of:
providing a substrate having a first surface, an opposite second surface, and at least one side edge defining a thickness of said substrate, said at least one side edge having a first peripheral region and a second peripheral region adjacent to said first peripheral region;
applying a fluid to said first surface and said first peripheral region of said at least one side edge by spraying a liquid stream against said first surface and said first peripheral region of said at least one side edge of said substrate at a pressure of from about 1 psi to about 20 psi to thereby form a barrier around said first surface and said first peripheral region to keep out any extraneous grinding residue; and
simultaneously removing by grinding said opposite second surface and said second peripheral region of said at least one side edge to form a third surface.

2. A method for making a wafer comprising the steps of:
providing a substrate having a first surface, an opposite second surface, and at least one side edge defining a thickness of said substrate, said at least one side edge having a first peripheral region and a second peripheral region adjacent to said first peripheral region;
applying a fluid to said first surface and said first peripheral region of said at least one side edge by spraying a liquid stream against said first surface and said first peripheral region of said at least one side edge of said substrate for about one minute to about 10 minutes to thereby form a barrier around said first surface and said first peripheral region to keep out any extraneous grinding residue; and simultaneously removing by grinding said opposite second surface and said second peripheral region of said at least one side edge to form a third surface.

3. A method for making a wafer comprising the steps of:

providing a substrate having a first surface, an opposite second surface, and at least one side edge defining a thickness of said substrate, said at least one side edge having a first peripheral region and a second peripheral region adjacent to said first peripheral region;

applying a fluid to said first surface and said first peripheral region of said at least one side edge by spraying a liquid stream against said first surface and said first peripheral region of said at least one side edge of said substrate at a temperature of from about 20° C. to about 40° C. to thereby form a barrier around said first surface and said first peripheral region to keep out any extraneous grinding residue; and simultaneously removing by grinding said opposite second surface and said second peripheral region of said at least one side edge to form a third surface.

4. A method for making a wafer comprising the steps of:

providing a substrate having a first surface, an opposite second surface, and at least one side edge defining a thickness of said substrate, said at least one side edge having a first peripheral region and a second peripheral region adjacent to said first peripheral region;

applying a fluid to said first surface and said first peripheral region of said at least one side edge by spraying a liquid stream against said first surface and said first peripheral region of said at least one side edge of said substrate at a pressure of from about 1 psi to about 20 psi, for about one minute to about 10 minutes, and at a temperature of from about 20° C. to about 40° C. to thereby form a barrier around said first surface and said first peripheral region to keep out any extraneous grinding residue; and simultaneously removing by grinding said opposite second surface and said second peripheral region of said at least one side edge to form a third surface.

5. A method for making a wafer comprising the steps of:

providing a substrate having a first surface, an opposite second surface, and at least one side edge defining a thickness of said substrate, said at least one side edge having a first peripheral region and a second peripheral region adjacent to said first peripheral region;

applying a fluid to said first surface and said first peripheral region of said at least one side edge by blowing a gas stream against said first surface and said first peripheral region of said at least one side edge of said substrate at a pressure from about 1 psi to about 60 psi, for about one minute to about 10 minutes, at a temperature of from about 20° C. to about 40° C. to thereby form a barrier around said first surface and said first peripheral region to keen out any extraneous grinding residue; and simultaneously removing by grinding said opposite second surface and said second peripheral region of said at least one side edge to form a third surface.

6. The method for making the wafer of claim 1 wherein said step of removing said opposite second surface and said second peripheral region of said at least one side edge of said substrate where said grinding is performed using a grinding wheel including diamonds having a size of from about 4 micron, to about 60 microns in diameter.

7. The method for making the wafer of claim 1 further including polishing.

\* \* \* \* \*